(12) United States Patent
Dunn (10) Patent No.: US 8,854,595 B2
(45) Date of Patent: Oct. 7, 2014

(54) CONSTRICTED CONVECTION COOLING SYSTEM FOR AN ELECTRONIC DISPLAY

(75) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 1282 days.

(21) Appl. No.: 12/411,925

(22) Filed: Mar. 26, 2009

(65) Prior Publication Data

US 2009/0244472 A1 Oct. 1, 2009

Related U.S. Application Data

(63) Continuation-in-part of application No. 12/234,307, filed on Sep. 19, 2008, now Pat. No. 8,767,165, and a continuation-in-part of application No. 12/234,360, filed on Sep. 19, 2008, and a continuation-in-part of application No. 12/237,365, filed on Sep. 24, 2008, and a continuation-in-part of application No. 12/235,200, filed on Sep. 22, 2008.

(60) Provisional application No. 61/039,454, filed on Mar. 26, 2008, provisional application No. 61/095,615, filed on Sep. 9, 2008, provisional application No. 61/095,616, filed on Sep. 9, 2008, provisional application No. 61/115,333, filed on Nov. 17, 2008, provisional application No. 61/138,736, filed on Dec. 18, 2008, provisional application No. 61/152,879, filed on Feb. 16, 2009, provisional application No. 61/033,064, filed on Mar. 3, 2008, provisional application No. 61/053,713, filed on May 16, 2008, provisional application No. 61/057,599, filed on May 30, 2008, provisional application No. 61/076,126, filed on Jun. 26, 2008.

(51) Int. Cl.
*G02F 1/1333* (2006.01)
*H05K 7/20* (2006.01)

(52) U.S. Cl.
CPC ...... *H05K 7/20972* (2013.01); *G02F 1/133385* (2013.01)
USPC ............................ 349/161; 361/694; 361/695

(58) Field of Classification Search
USPC ................... 349/161, 58; 361/692, 694–696; 165/104.34, 121
See application file for complete search history.

(56) References Cited

U.S. PATENT DOCUMENTS

| | | | |
|---|---|---|---|
| 4,093,355 | A | 6/1978 | Kaplit et al. |
| 4,593,978 | A | 6/1986 | Mourey et al. |

(Continued)

FOREIGN PATENT DOCUMENTS

| | | |
|---|---|---|
| GB | 2402205 | 1/2004 |
| JP | 03153212 | 7/1991 |

(Continued)

OTHER PUBLICATIONS

Zeef, Hubing, EMC analysis of 18' LCD Monitor, Aug. 2000, 1 page.

*Primary Examiner* — Jerry Blevins
(74) *Attorney, Agent, or Firm* — Standley Law Group LLP (57) ABSTRACT

Preferred embodiments provide a cooling system for an electronic display. A constricted convection channel is used to force cooling air against a posterior surface of the electronic display. Fans may be used to propel or pull air through the constricted convection channel in a substantially uniform manner. A refrigeration unit or thermoelectric module may be employed to cool or heat the air traveling through the constricted convection channel. Some embodiments include a closed loop which extracts heat (or adds heat) to the front display surface.

20 Claims, 10 Drawing Sheets

(56) References Cited

U.S. PATENT DOCUMENTS

| | | | |
|---|---|---|---|
| 4,634,225 A | 1/1987 | Haim et al. | |
| 5,029,982 A | 7/1991 | Nash | |
| 5,088,806 A | 2/1992 | McCartney et al. | |
| 5,247,374 A | 9/1993 | Terada | |
| 5,559,614 A | 9/1996 | Urbish et al. | |
| 5,748,269 A | 5/1998 | Harris et al. | |
| 5,767,489 A | 6/1998 | Ferrier | |
| 5,818,010 A | 10/1998 | McCann | |
| 5,991,153 A * | 11/1999 | Heady et al. | 361/704 |
| 6,089,751 A | 7/2000 | Conover et al. | |
| 6,157,432 A | 12/2000 | Helbing | |
| 6,191,839 B1 | 2/2001 | Briley | |
| 6,417,900 B1 | 7/2002 | Shin et al. | |
| 6,428,198 B1 * | 8/2002 | Saccomanno et al. | 362/559 |
| 6,493,440 B2 * | 12/2002 | Gromatzky et al. | 379/161 |
| 6,535,266 B1 | 3/2003 | Nemeth et al. | |
| 6,628,355 B1 | 9/2003 | Takahara | |
| 6,839,104 B2 | 1/2005 | Taniguchi et al. | |
| 6,885,412 B2 | 4/2005 | Ohnishi et al. | |
| 6,943,768 B2 | 9/2005 | Cavanaugh et al. | |
| 7,284,874 B2 | 10/2007 | Jeong et al. | |
| 2002/0101553 A1 | 8/2002 | Enomoto et al. | |
| 2002/0126248 A1 | 9/2002 | Yoshida | |
| 2003/0007109 A1 | 1/2003 | Park | |
| 2004/0036834 A1 | 2/2004 | Ohnishi et al. | |
| 2004/0165139 A1 | 8/2004 | Anderson et al. | |
| 2006/0082271 A1 | 4/2006 | Lee et al. | |
| 2006/0092348 A1 * | 5/2006 | Park | 349/64 |
| 2006/0132699 A1 | 6/2006 | Cho et al. | |
| 2006/0177587 A1 * | 8/2006 | Ishizuka et al. | 427/348 |
| 2006/0209266 A1 | 9/2006 | Utsunomiya | |
| 2007/0151664 A1 | 7/2007 | Shin | |
| 2009/0154096 A1 * | 6/2009 | Iyengar et al. | 361/694 |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| KR | 1020070070675 | 7/2007 |
| WO | WO2005079129 | 8/2005 |

* cited by examiner

CONSTRICTED CONVECTION COOLING SYSTEM FOR AN ELECTRONIC DISPLAY

CROSS-REFERENCE TO RELATED APPLICATIONS

This application is a non-provisional application of U.S. provisional application No. 61/039,454 filed Mar. 26, 2008 and is hereby incorporated by reference as if fully cited herein. This application is a non-provisional application of U.S. provisional application No. 61/095,615 filed Sep. 9, 2008 and is hereby incorporated by reference as if fully cited herein. This application is a non-provisional application of U.S. provisional application No. 61/095,616 filed Sep. 9, 2008 and is hereby incorporated by reference as if fully cited herein. This application is a non-provisional of U.S. Application No. 61/115,333 filed Nov. 17, 2008 and is hereby incorporated by reference as if fully cited herein. This application is a non-provisional application of U.S. application No. 61/138,736 filed Dec. 18, 2008 and is hereby incorporated by reference as if fully cited herein. This application is a non-provisional application of U.S. application No. 61/142,879 filed Feb. 16, 2009. This application is a continuation-in-part of U.S. application Ser. No. 12/234,307 filed Sep. 19, 2008, which is a non-provisional application of U.S. Application No. 61/033,064 filed Mar. 3, 2008, each of which are hereby incorporated by reference in their entirety as if fully cited herein. This application is a continuation-in-part of U.S. application Ser. No. 12/234,360 filed Sep. 19, 2008, which is a non-provisional application of U.S. Application No. 61/053,713 filed May 16, 2008 each of which are hereby incorporated by reference in their entirety as if fully cited herein. This application is a continuation-in-part of U.S. application Ser. No. 12/237,365 filed Sep. 24, 2008, which is a non-provisional application of U.S. Application No. 61/057,599 filed May 30, 2008 each of which are hereby incorporated by reference in their entirety as if fully cited herein. This application is a continuation-in-part of U.S. application Ser. No. 12/235,200 filed Sep. 22, 2008, which is a non-provisional of U.S. Application No. 61/076,126 filed Jun. 26, 2008 each of which are hereby incorporated by reference in their entirety as if fully cited herein.

TECHNICAL FIELD

Exemplary embodiments generally relate to cooling systems and in particular to cooling systems for electronic displays.

BACKGROUND OF THE ART

Conductive and convective heat transfer systems for electronic displays are known. These systems of the past generally attempt to remove heat from the electronic components in a display through as many sidewalls of the display as possible. In order to do this, the systems of the past have relied primarily on fans for moving air past the components to be cooled and out of the display. In some cases, the heated air is moved into convectively thermal communication with fins. Some of the past systems also utilize conductive heat transfer from heat producing components directly to heat conductive housings for the electronics. In these cases, the housings have a large surface area, which is in convective communication with ambient air outside the housings. Thus, heat is transferred convectively or conductively to the housing and is then transferred into the ambient air from the housing by natural convection.

While such heat transfer systems have enjoyed a measure of success in the past, improvements to displays require even greater cooling capabilities.

SUMMARY OF THE EXEMPLARY EMBODIMENTS

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Furthermore, the market is demanding larger screen sizes for displays. With increased electronic display screen size and corresponding display window size more heat will be generated and more heat will be transmitted into the displays.

In the past, many displays have functioned satisfactorily with ten or twelve inch screens. Now, many displays are in need of screens having sizes greater than or equal to twenty-four inches that may require improved cooling systems. For example, some outdoor applications call for seventy inch screens and above. With increased heat production with the larger screens and radiative heat transfer from the sun through the display window, heat dissipation systems of the past, which attempt to cool the entire interior of the display with fins and fans, are no longer adequate.

A large fluctuation in temperature is common in the devices of the past. Such temperature fluctuation adversely affects the electronic components in these devices. Whereas the systems of the past attempted to remove heat from the entire interior of the display, a preferred embodiment causes directed convective heat transfer from the anterior of the display. By the aspects described below, the present invention has made consistent cooling possible for electronic displays having screens of sizes greater than or equal to twelve inches. For example, cooling of a seventy inch screen can be achieved, even in extremely hot climates. Greater cooling capabilities are provided by the device and method described and shown in more detail below.

An exemplary embodiment relates to a constricted convection cooling system and a method of cooling an electronic display. An exemplary embodiment includes an external housing and a constricted convection plate. The external housing preferably includes an air entrance end and an exhaust end. The air entrance end defines an entrance aperture; while the exhaust end defines an exit aperture. The constricted convection plate is preferably mounted to the posterior display surface. This posterior display surface may be the posterior surface of the backlight assembly or the posterior surface of any other thin panel display assembly (OLED, plasma, etc.). The constricted convection plate further defines a constricted convection cooling channel immediately behind the posterior display surface. The convection cooling channel may be adapted to receive air entering the entrance aperture and adapted to expel air through the exit aperture.

The air entering the constricted convection cooling channel may be from a refrigerated air source in communication with the entrance opening, or alternatively may be ambient air from the display surroundings. A septum in association with the external housing may be adapted to direct air into the constricted convection cooling channel. One or more fans may be used to draw the cooling air through the constricted convection cooling channel. In other embodiments, one or more fans may be used to force air through the constricted convection cooling channel. In exemplary embodiments, a plurality of fans are used to draw a substantially uniform flow of air through the constricted convection cooling channel. This helps to cool the display assembly in a uniform manner. This is particularly beneficial with an LED backlight, as individual LEDs may fail prematurely if exposed to high levels of heat for an extended period of time.

The foregoing and other features and advantages will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Exemplary embodiments relate to a cooling system for an electronic display and to combinations of the cooling system and the electronic display. Exemplary embodiments provide a constricted convection cooling system for an electronic display.

Figure 1:
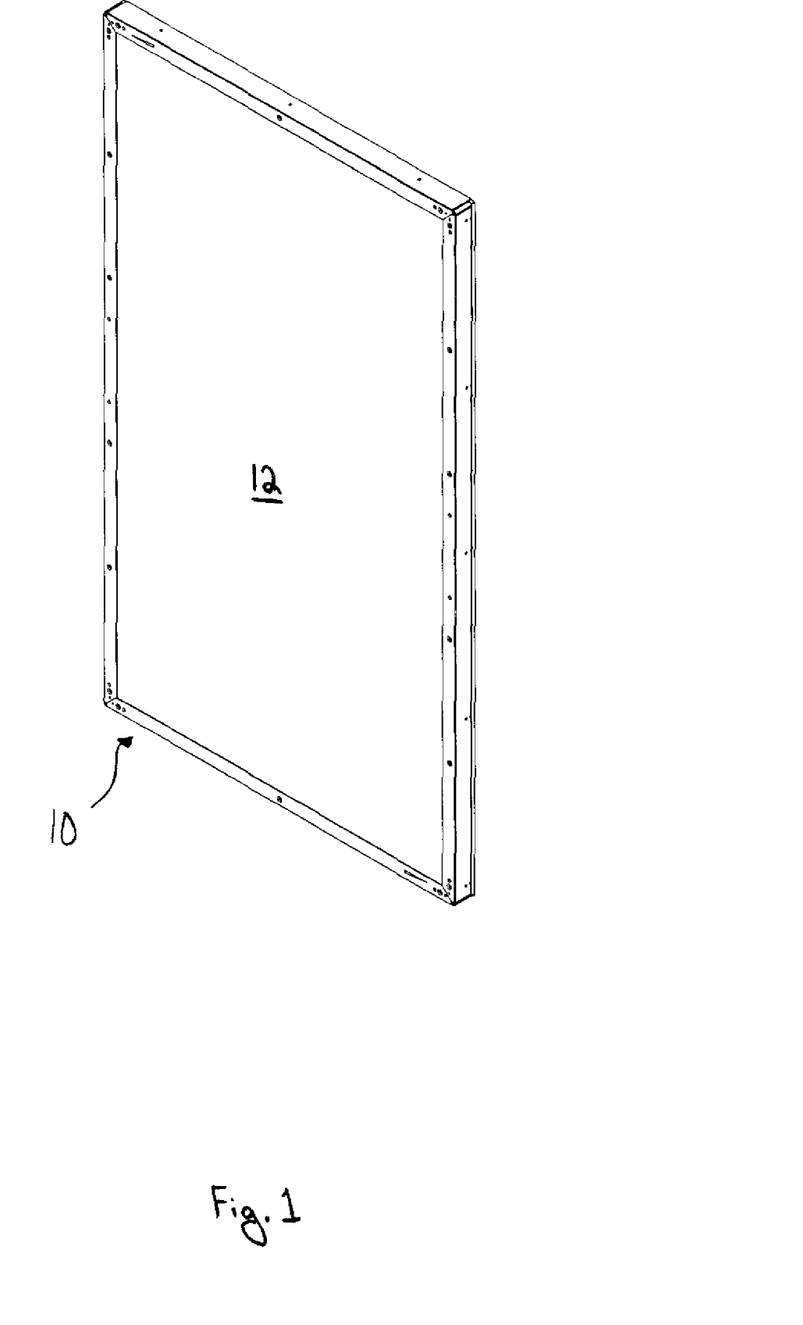
FIG. 1 is a perspective view of a display that may be used in an exemplary embodiment.

FIG. 1 is a perspective view of a display that may be used in an exemplary embodiment. As may be appreciated, when the display 10 is exposed to heat and/or sunlight, the temperatures inside the display 10 will vary greatly without some kind of cooling device. As such, the electronics including the display screen 12 (e.g., LCD screen) will have a greatly reduced life span. By implementing certain embodiments of the cooling system disclosed herein, temperature fluctuation is greatly reduced. This cooling capability has been achieved in spite of the fact that larger screens generate more heat than smaller screens.

The display 10 shown may be equipped with a backlight assembly. Modern displays are required to be extremely bright and this is especially true with displays that are intended for use in bright environments, especially outdoor environments which see direct or indirect sunlight. Accordingly, the backlight assembly may be required to be very bright and as such may generate a significant amount of heat. Exemplary embodiments provide excellent cooling of the backlight assembly, through the use of the constricted convection system. Accordingly, it may be placed in direct sunlight. Although the cooling system may be used on smaller displays, it is especially useful for larger LCD, LED, plasma, or organic light emitting diodes (OLED) displays. These screens, especially with displays over 24 inches, face significant thermoregulatory issues in outdoor environments.

It is to be understood that the spirit and scope of the disclosed embodiments includes cooling of displays including, but not limited to LCDs. By way of example and not by way of limitation, the present invention may be used in conjunction with displays selected from among LCD (including TFT or STN type), light emitting diode (LED), organic light emitting diode (OLED), field emitting display (FED), cathode ray tube (CRT), and plasma displays. Furthermore, embodiments of the present invention may be used with displays of other types including those not yet discovered. In particular, it is contemplated that the present invention may be well suited for use with full color, flat panel OLED displays. While the embodiments described herein are well suited for outdoor environments, they may also be appropriate for indoor applications (e.g., factory environments) where thermal stability of the display may be at risk. Furthermore, while most of this disclosure is written in terms of cooling, embodiments enclosed herein may be utilized for heating in particular applications. The means for cooling the air in the cooling systems may be replaced with a means for heating the air. A heating system for an electronic display would allow usage in climates/environments normally too cold for liquid crystal or other like technologies.

Figure 2:
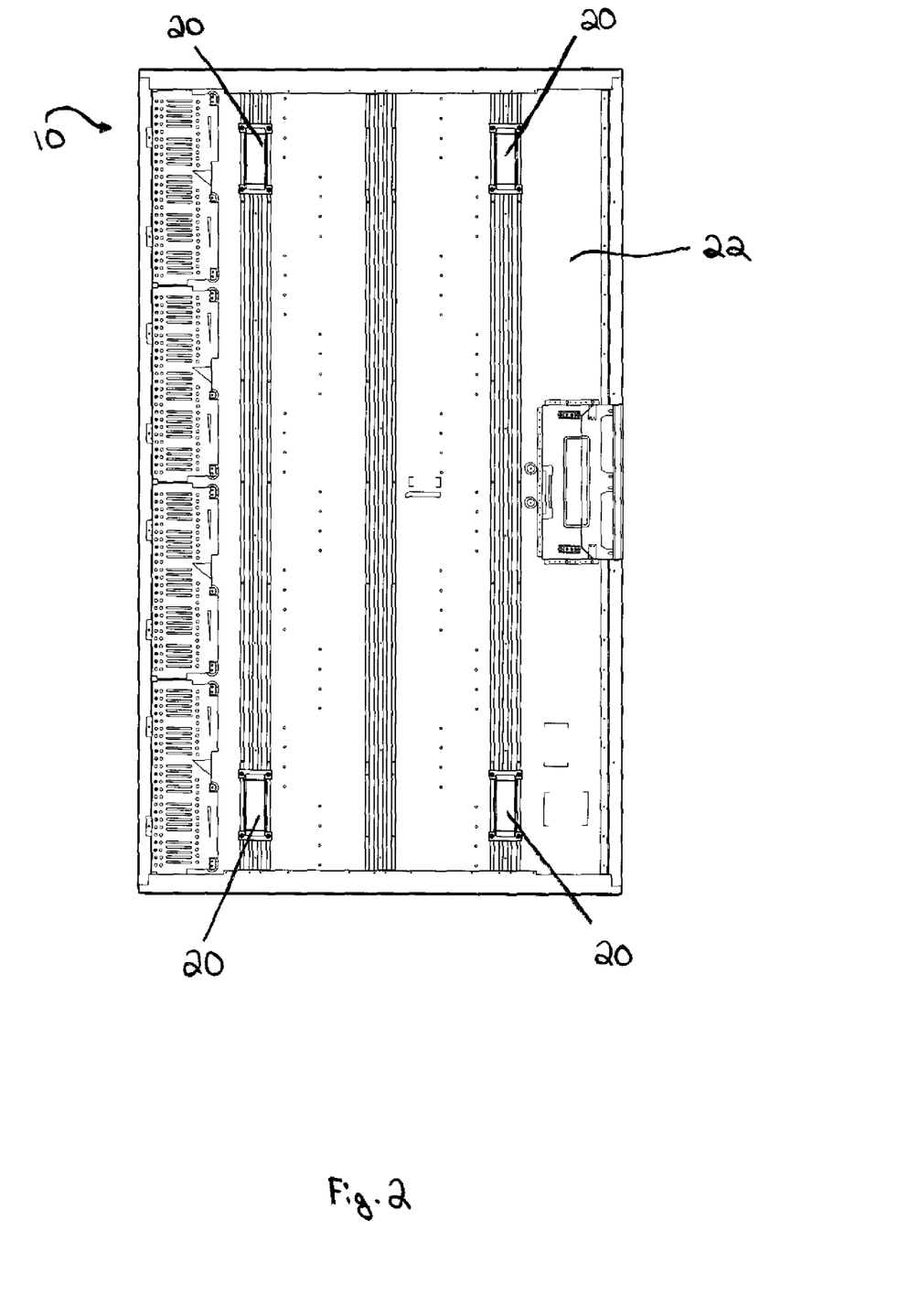
FIG. 2 is a posterior view of a display that may be used in an exemplary embodiment.

FIG. 2 is a posterior view of a display 10 that may be used in an exemplary embodiment. In a typical display, the display posterior 22 may include four mounting brackets 20. The four mounting brackets 20 are shown by way of example and not by way of limitation, exemplary embodiments may be used with various numbers of mounting brackets 20. The mounting brackets 20 serve to attach the constricted convection plate 30 (shown in FIG. 3) to the display posterior 22. The height that the mounting brackets 20 extending from the display posterior 22 define the depth of the constricted convection cooling channel 50 (shown in FIG. 5). This may also be described as the gap distance between the display posterior 22 and the constricted convection plate.

In an exemplary embodiment, the display posterior 22 may be the posterior surface of a backlight assembly. The backlight assembly may comprise a printed circuit board (PCB) with a plurality of LEDs mounted to the anterior surface. The PCB may have a low level of thermal resistance between the anterior and posterior surfaces such that heat which is generated by the LEDs may be transferred to the posterior surface of the of the backlight assembly, and subsequently removed by air within the constricted convection channel. The PCB may comprise a metal core PCB and the posterior surface of the PCB may be metallic so that air within the constricted convection channel may cool the metallic posterior surface (and subsequently the backlight assembly) more easily and efficiently.

Figure 3:
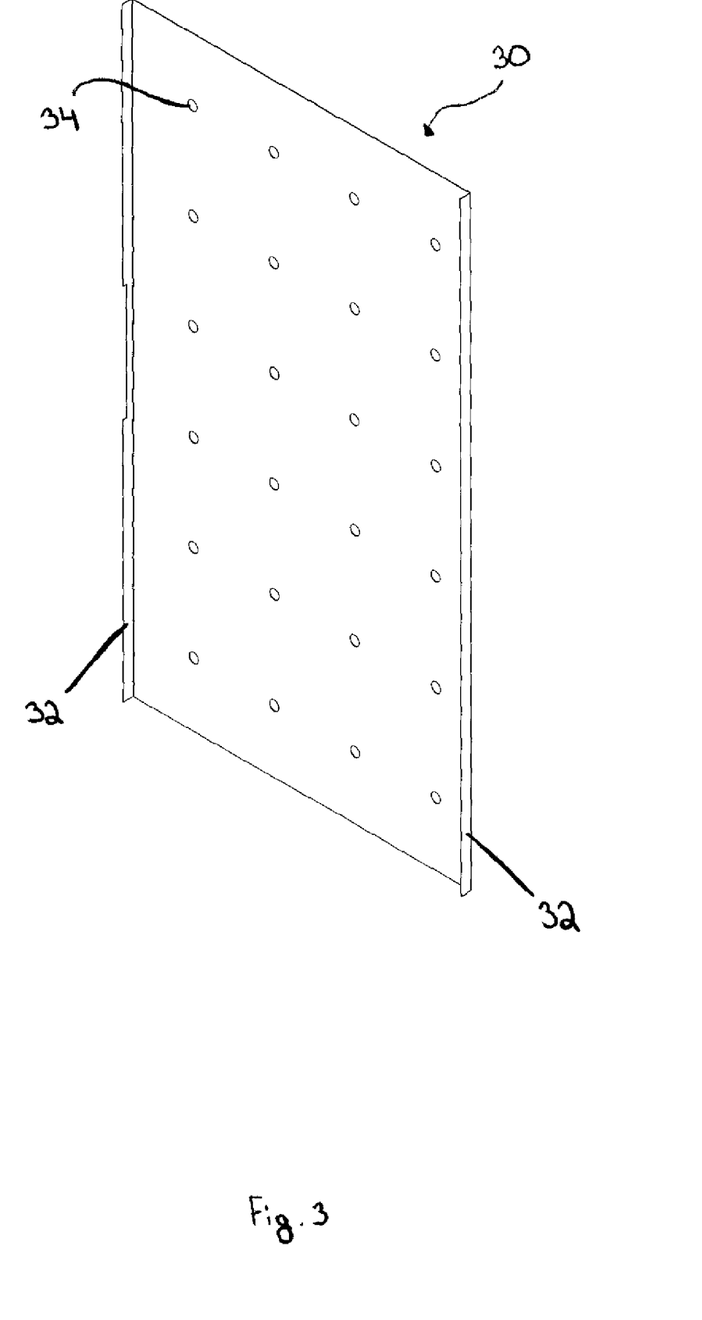
FIG. 3 is a perspective view of the constricted convection plate.

FIG. 3 is an exemplary embodiment of the constricted convection plate 30. The constricted convection plate 30 may have angled side panels 32. The angled side panels 32 are adapted to extend from the constricted convection plate 30 and make contact with the display posterior 22 and direct air through the constricted convection channel 50 (shown in FIG. 5). The constricted convection panel 30 may also be constructed to include access apertures 34. The access apertures 34 are defined by the constricted convection plate 30 and allow access to hardware found on the display posterior 22; without the need to remove the constricted convection plate 30. The access apertures 34 may be plugged before operation to maintain directed contact between the refrigerated air and the posterior display surface 22.

The width of the constricted convection channel 50 may vary according to the thermal requirements of a particular application. In some embodiments, the constricted convection channel 50 may be one-half inch or less. In other embodiments, the constricted convection channel 50 may be between one-half inch and one inch. In still other embodiments, the constricted convection channel 50 may be between one and five inches.

Figure 4:
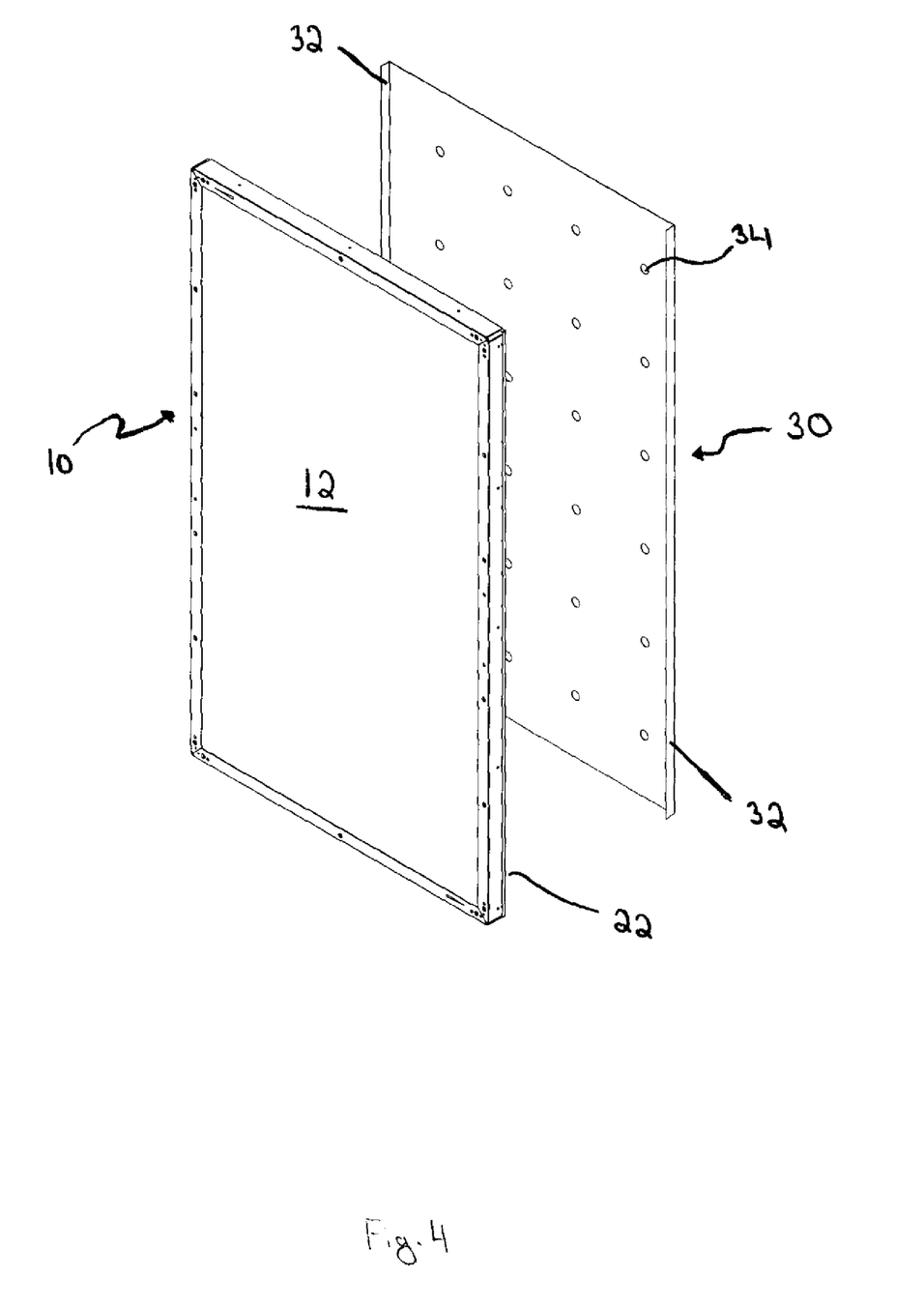
FIG. 4 is an exploded view of a display that may be used in an exemplary embodiment and an exemplary embodiment of the constricted convection plate.

FIG. 4 is an exploded view showing the relationship of a display 10 that may be used in an exemplary embodiment and an exemplary embodiment of the constricted convection plate 30. As described above, the constricted convection plate 30 may be attached to the display posterior 22 by the mounting brackets 20 (shown in FIG. 2). The size of the constricted convection plate 30 may be of sufficient size to cover the entire posterior display surface 22. In other exemplary embodiments, the constricted convection plate 30 may only cover a portion of the posterior display surface 22. Therefore, the size of the constricted convection plate 30 may be adjusted to provide sufficient cooling of the display posterior 22.

Figure 5A:
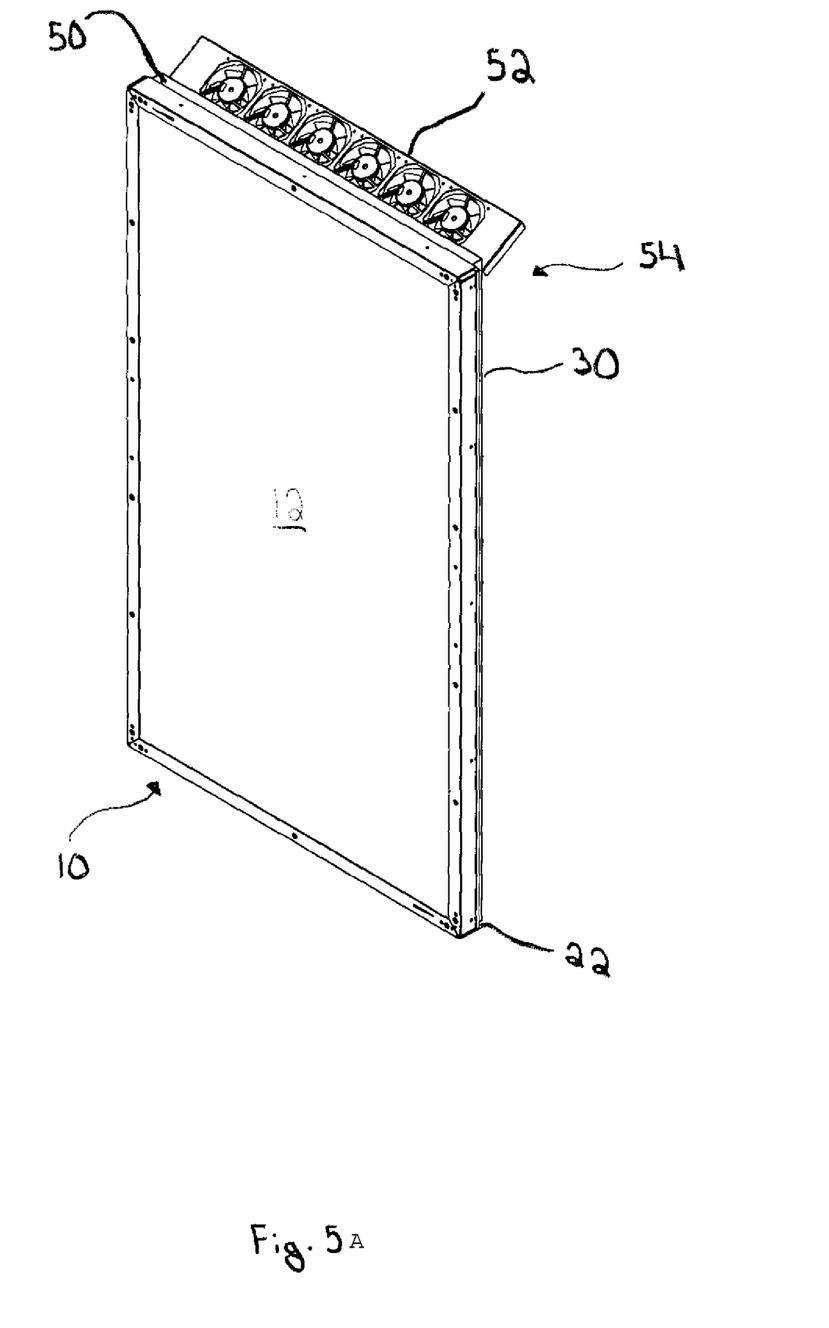
FIG. 5A is a front perspective view of a fan and display that may be used in an exemplary embodiment and an exemplary embodiment of the constricted convection plate.

In FIG. 5A, the constricted convection plate 30 is shown mounted to the display posterior 22. The mounting brackets 20 (shown in FIG. 2) may be used to secure the constricted convection plate 30. The constricted convection plate 30 and the display posterior 22 define a constricted convection cooling channel 50 immediately behind the display posterior 22. As discussed above, in some embodiments the constricted convection cooling channel 50 may run the length and width of the display 10. In other embodiments, the constricted convection cooling channel 50 may be only of sufficient size to provide thermal stability to the display 10.

The constricted convection cooling system 54 may include a means for increasing the speed at which air travels through the constricted convection cooling channel 50. This means may include one or more fans 52 which may be positioned near an opening of the constricted convection cooling channel 50. The fans 52 may either force the air through the constricted convection channel 50 or pull the air through the constricted convection channel 50. Alternatively, a plurality of fans may be used to both push and pull air through the constricted convection cooling channel 50. The use of one or more fans 52 may provide increased velocity of the air traveling through the constricted convection cooling channel 50, thus increasing the speed with which heat is transferred from the display posterior 22.

In other exemplary embodiments, a means for cooling the air which passes through the constricted convection cooling channel 50 may be used. A means for cooling the air may include, but is not limited to, a conditioning unit, a refrigeration unit, or any other means to decrease the temperature of the air passing through the constricted convection plate 30. Alternatively, ambient air from the surroundings may be drawn in and forced within the constricted convection channel 50.

Figure 5B:
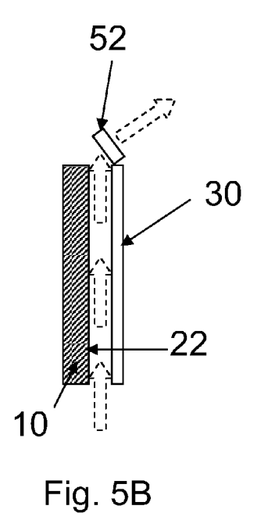
FIGS. 5B through 5F show side views of additional embodiments for the constricted convection system.
Figure 5C:
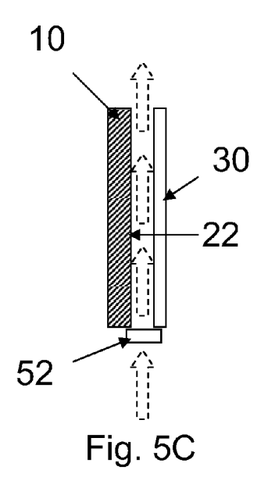
Figure 5D:
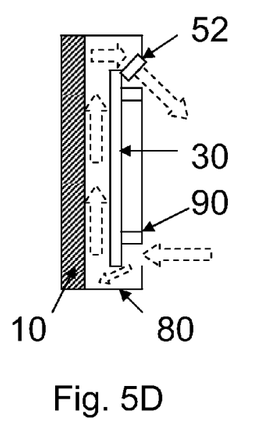
Figure 5E:
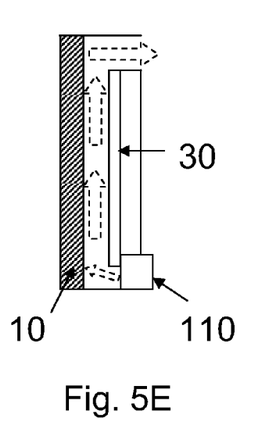
Figure 5F:
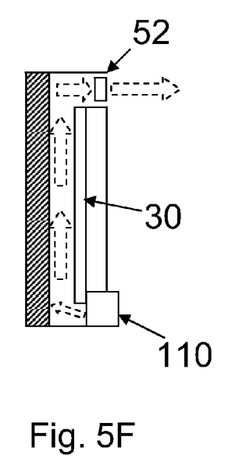

FIGS. 5B through 5F show side views of additional embodiments for the constricted convection system. In FIG. 5B, one or more fans 52 are used to draw ambient air between the posterior display surface 22 and the constricted convection plate 30. In FIG. 5C, one or more fans 52 are used to force ambient air between the posterior display surface 22 and the constricted convection plate 30. FIG. 5D is similar to FIG. 5B except that the housing 80 and the septum 90 are used to direct the flow of air. In FIG. 5E, an air conditioning unit 110 is used to both cool the air and to force the cooled air between the posterior display surface 22 and the constricted convection plate 30. Finally in FIG. 5F, an air conditioning unit 110 is used in combination with one or more fans 52.

Figure 6:
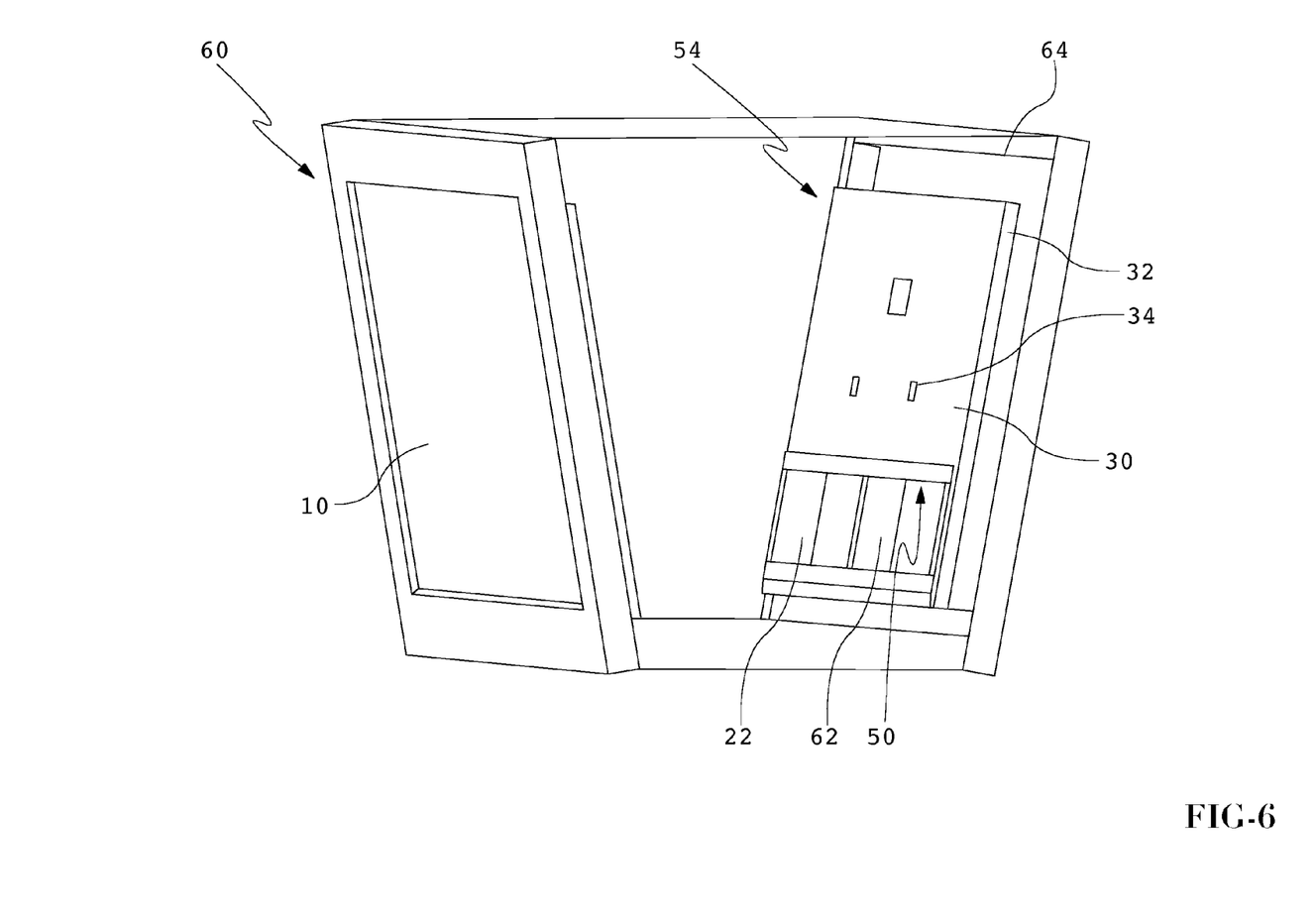
FIG. 6 is a perspective view of a double display housing utilizing an exemplary embodiment of the constricted convection air cooling system for an electronic display.

FIG. 6 is a double display housing 60 utilizing an exemplary embodiment of the constricted convection air cooling system 54. A constricted convection plate 30 is mounted to a display posterior 22. The constricted convection plate 30 and the display posterior 22 define a constricted convection cooling channel 50 immediately behind the display posterior 22. An entrance opening 62 adapted to receive air is defined by the constricted convection plate 30. An exit opening 64 adapted to expel air from the constricted convection cooling channel 50 is defined by the constricted convection plate 30 and the display posterior 22. As above, the constricted convection plate 30 may have access apertures 34. The access apertures 34 allow access to hardware located behind the constricted convection plate 30. The access apertures 34 may be closed before use using plugs or other similar devices (not shown in the Figures).

An air source (not shown in the Figures) may be in communication with the entrance opening 62. Air is forced through the entrance opening 62 and into the constricted convection channel 50. The constricted convection channel 50 directs the air into contact with the display posterior 22 increasing the heat transfer from the display. After passing over the display posterior 22, the air exits the constricted convection channel 50 through the exit opening 64. The expelled air may then pass through a portion of the double display housing 60 into the atmosphere.

As above, a means for cooling the air (not shown in the Figures) forced into the constricted convection cooling channel 50 may be employed. The means for cooling the air may include, but is not limited to, a conditioning unit, a refrigerating unit, a thermoelectric unit, or any other means to decrease the temperature of the air before entering the constricted convection cooling channel 50.

Figure 7:
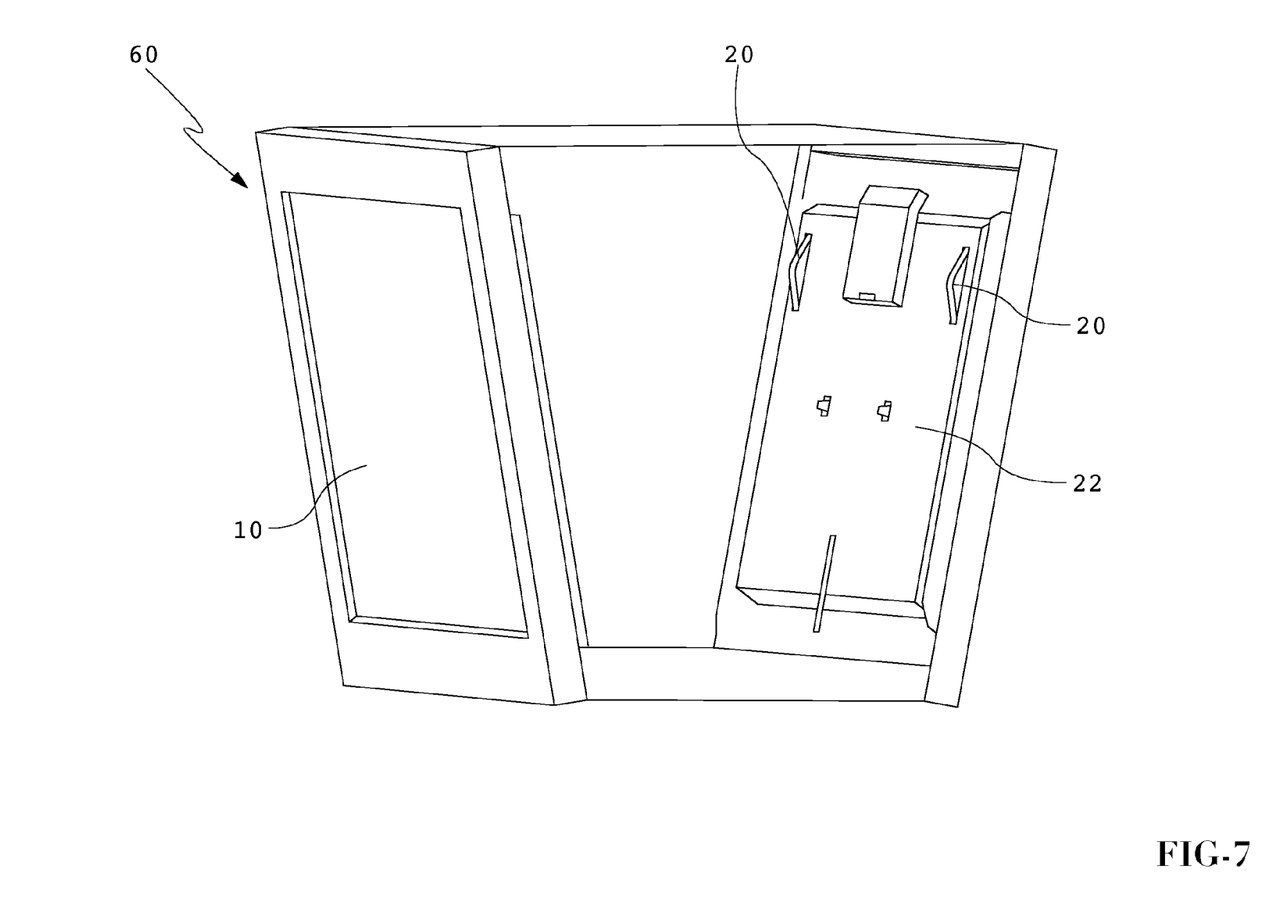
FIG. 7 is a posterior view of a display the may be found in a double display housing utilizing an exemplary embodiment of the constricted convection air cooling system for an electronic display.

FIG. 7 is a double display housing 60 that may use an exemplary embodiment of the constricted convection air cooling system 54. The display posterior 22 may include mounting brackets 20. The mounting brackets 20 are shown by way of example and not by way of limitation. The present invention may use various shapes and numbers of mounting brackets 20. The mounting brackets 20 may serve to attach the constricted convection plate 30 (shown in FIG. 3) to the display posterior 22. The height of the mounting brackets 20 extend from the display posterior defines the depth of the constricted convection cooling channel 50 (shown in FIG. 5). Further embodiments may not utilize mounting brackets as they are not necessary to practice the invention.

As with other exemplary embodiments, a means for forcing air within the system and increasing the speed at which the air travels through the constricted convection cooling channel 50 may be used. The means for increasing the air speed may be in association with either the entrance opening 62 or the exit opening 64. The means for increasing the air speed may include, but is not limited to, one or more fans (shown in FIG. 5).

Figure 8:
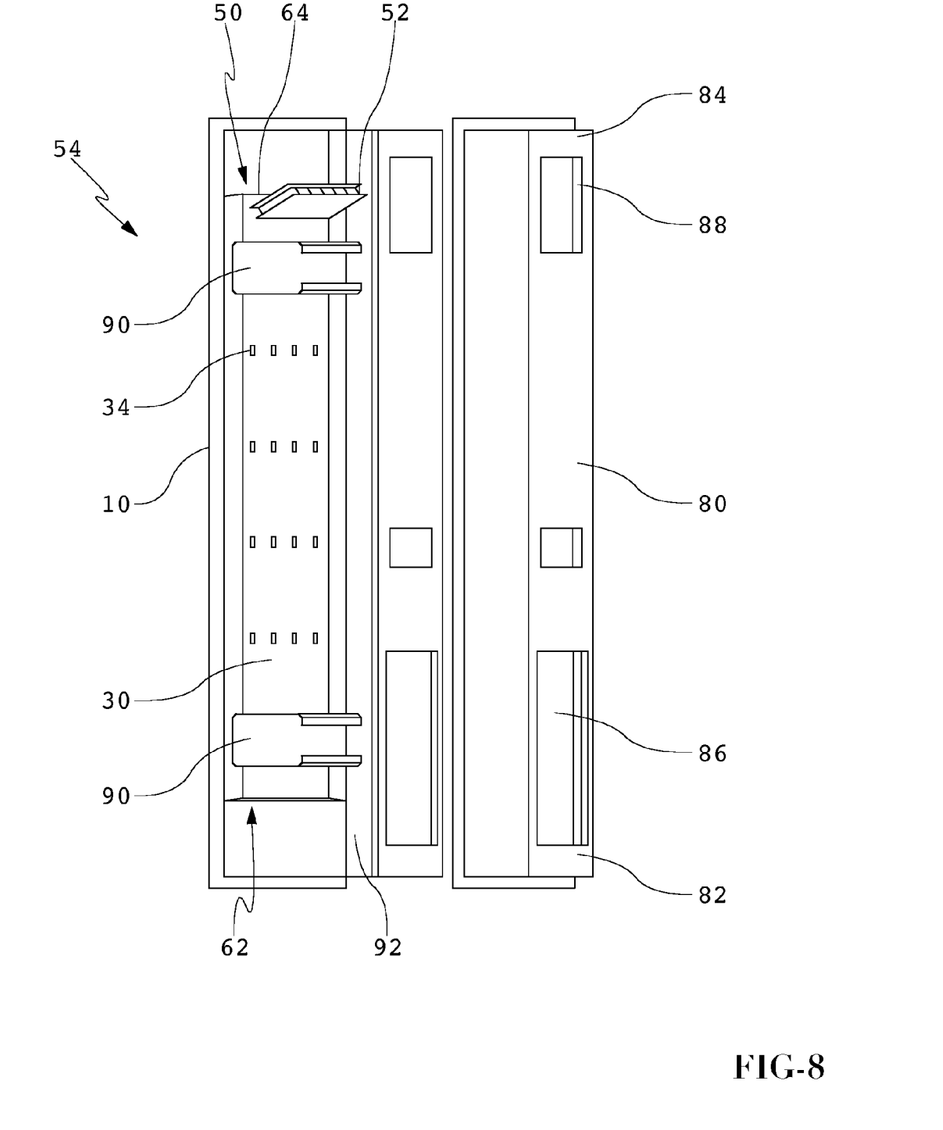
FIG. 8 is an exploded view of an exemplary embodiment of the constricted convection air cooling system for an electronic display.

FIG. 8 is an exploded view of another embodiment of the constricted convection cooling system 54. The display 10 may be encased in an external housing 80. The external housing 80 may have an air entrance end 82 and an exhaust end 84. The air entrance end 82 defines an entrance aperture 86. The exhaust end 84 defines an exit aperture 88. The constricted convection plate 30 and the display posterior 22 (not shown in FIG. 8) define a constricted convection cooling channel 50. The constricted convection plate 30 further defines an entrance opening 62 and an exit opening 64. The entrance opening may be adapted to receive air entering the entrance aperture 86. The exit opening may be adapted to expel air through the exit aperture 88.

Septa 90 are associated with the external housing 80. The septa 90 may be adapted to prevent air from evading the constricted convection channel 50. The septa 90 may also be adapted to provide support and an attachment port for the external housing 80.

Air or another appropriate gas may be in gaseous communication with the entrance opening 86. The air then passes through the entrance opening 86 into a middle chamber 92. The middle chamber 92 is defined by the external housing 80 and the constricted convection plate 30. Once the air enters the middle chamber it may be directed through the entrance opening 62. A septum 90 may be positioned to direct air into the entrance opening 62 and prevent the air evading the entrance opening 62. After passing through the entrance opening 62, the air may enter the constricted convection cooling channel 50. As the air passes through the constricted convection cooling channel heat is transferred from the display posterior to the air.

After absorbing heat from the display posterior, the air may exit the constricted convection channel 50 through the exit opening 64. A septum 90 may be used to prevent the exiting air from evading the exit aperture 88, and to direct the air towards the exit aperture 88. The air is then expelled through the exit aperture 88 in to the surrounding atmosphere.

To assist in the movement of air through the constricted convection channel 50, a means to force the air into the channel and increase the air speed may be used. Increasing the air speed and the volumetric flow rate of the air may allow for increased heat removal. The means to increase the air speed may include, but is not limited to, a fan 52. The fan 52 may be associated with the exit opening 64 and may draw air from the constricted convection channel 50. In other embodiments, the fan 52 may be associated with the entrance opening 62 and may force air into the constricted convection channel 50. Other embodiments may utilize a combination of both drawing the air from the channel and forcing the air into the channel. In an exemplary embodiment, a plurality of fans would be distributed across the entire exit opening 64 (or entrance opening 62, or both) in order to produce a uniform flow of air across the posterior display surface to facilitate uniform cooling.

In other exemplary embodiments, a means for cooling air in gas communication with the entrance opening 62 may be employed. The means for cooling the air may include, but is not limited to, a conditioning unit, a refrigerating unit, a thermoelectric unit, or any other device that decreases the temperature of the air. Cooling the air further increases the air's ability to transfer heat from the display posterior 22. The means for cooling air may be housed within the external housing 80, or it may be an external unit.

Figure 9:
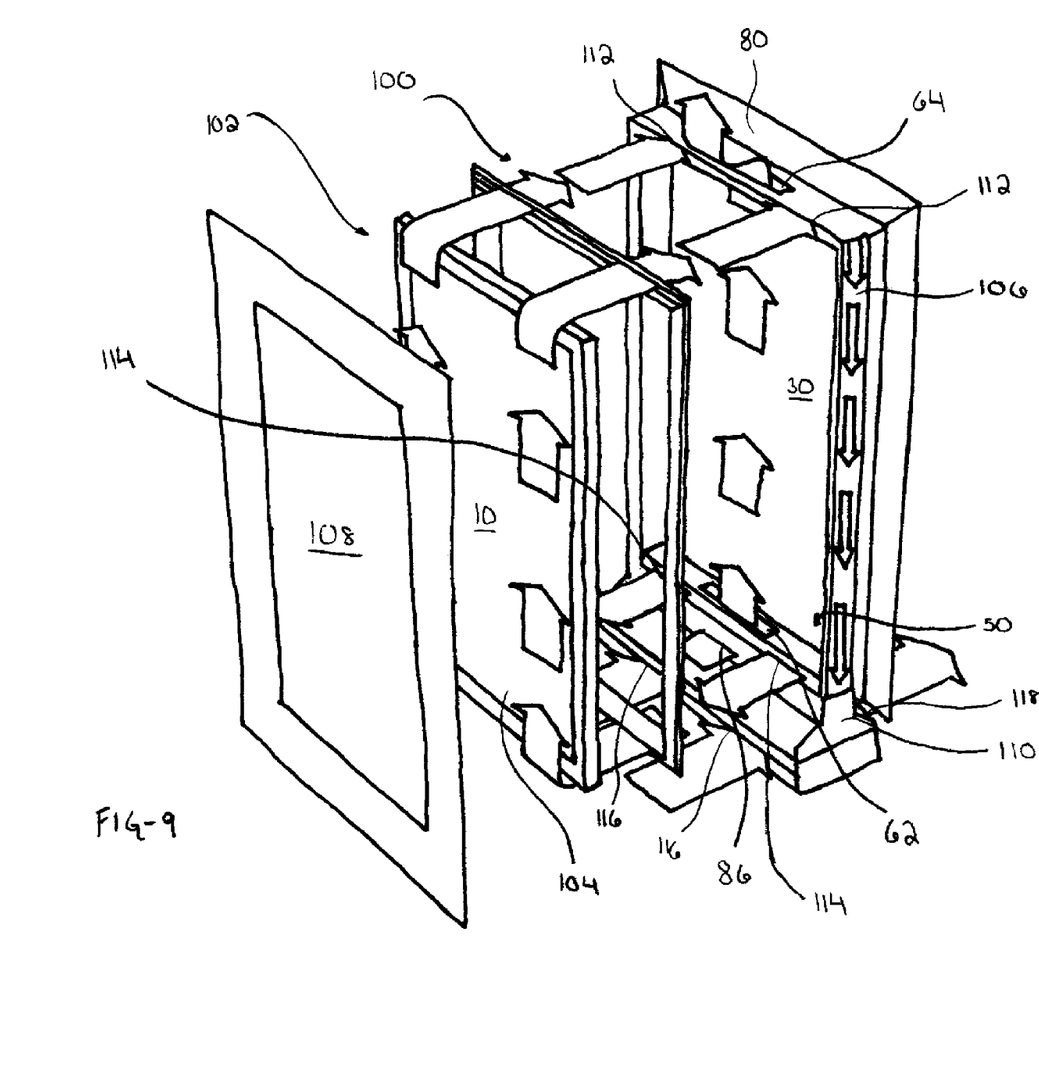
FIG. 9 is a perspective view of an exemplary embodiment of the constricted air cooling system for an electronic display of the present invention with an optional isolated gas cooling system.

FIG. 9 is a display 10 using and exemplary embodiment of the constricted convection cooling system, where three cooling pathways are used. The first cooling pathway is comprised of the constricted convection plate 30 immediately behind the display posterior. The second cooling pathway is a closed loop and is comprised of the isolated gas cooling system 100. The third cooling pathway is comprised of the ambient air vent system used to cool the refrigeration unit 110. In some embodiments, the first and/or second pathways may include refrigerated air. In still other exemplary embodiments, the first and/or second pathways may contain heated air. The ability to provide cooled and heated air in the pathways allows use of an outdoor electronic display across a variety of climates. Other exemplary embodiments may contain any combination of cooling/heating pathways. For applications which require both heating and cooling, a thermoelectric module may be used as the refrigeration unit 110. Thermoelectric modules are commonly available which can run in both cooling and heating modes.

In the first cooling pathway, a constricted convection plate 30 may be mounted immediately behind the display posterior. A constricted convection channel 50 is defined by the gap between the constricted convection plate 30, and the display posterior.

Air may enter the entrance aperture 86, which is defined by external housing 80. The air passes through the entrance aperture 86 to the entrance opening 62, and into the constricted convection channel 50. The air may then be expelled into the atmosphere from the constricted convection channel 50 through the exit opening 64. Optionally, a means for increasing the speed of the air traveling through the constricted convection channel 50 may be included either associated with the entrance opening 62 or the exit opening 64 or both.

The second cooling pathway may be an exemplary embodiment of an isolated gas cooling system 100. The isolated gas cooling chamber 102 comprises a closed loop which includes a gas chamber 104 and return air passage 106. The gas chamber 104 includes a transparent plate 108. The term "isolated gas" refers to the fact that the gas within the isolated gas cooling chamber 102 is essentially isolated from the external air. In the embodiment shown, the isolated gas cooling system 100 comprises refrigerated air. Because the gas chamber 102 is positioned in front of the display 10, the gas should be substantially free of dust or other contaminates that might negatively affect the display image.

The isolated gas may be almost any transparent gas, including, but not limited to, normal air, nitrogen, helium, or any other transparent gas. The gas is preferably colorless so as not to affect the image quality. Furthermore, the isolated gas cooling chamber 102 need not necessarily be hermetically sealed from the external air. It is sufficient that the gas in the chamber is isolated to the extent that dust and contaminates may not substantially enter the first gas chamber.

The gas chamber 104 is in gaseous communication with the return air passage 106. A refrigeration unit 110 may be provided within the exemplary embodiments. The refrigeration unit may be any device which cools the isolated gas which travels around the isolated gas cooling chamber and sometimes through the constricted convection channel. Along with cooling the air, the refrigeration unit 110 may be utilized to propel the gas around the isolated gas cooling chamber 102 or through the constricted convection channel. The gas chamber 104 includes at least one front glass 108 mounted in front of the display 10. The front glass 108 may be set forward from the display 10 by spacers (not shown in the Figures). The spacing members define the depth of the narrow channel passing in front of the display 10. The spacing members may be independent of alternatively may be integral with some with some other component of the device (i.e., integral with the front plate). The display 10, the spacing members, and the front glass 108 define the narrow gas chamber 104. The gas chamber 104 may be gaseous communication with the return air passage 106 through entrance openings 112 and exit openings 114.

As the isolated gas in the gas chamber 104 traverses the isolated gas cooling chamber 102 it contacts the display 10 surface. Contacting the isolated gas directly to the display 10 allows convective heat transfer from the display 10 to the isolated gas. By utilizing the display 10 as the posterior surface wall of the gas chamber 104, there are fewer surfaces to impact the visible light traveling through the display 10. Furthermore, the device will be lighter and cheaper to manufacture.

Although the embodiment shown utilizes the display 10, certain modifications and/or coatings (e.g., anti-reflective coatings) may be added to the display 10, or to other components of the system in order to accommodate the coolant gas or to improve the optical performance of the device. In the embodiment shown, the display 10 may be the front glass plate of a liquid crystal display (LCD) stack. However, almost any display surface may be suitable for embodiments of the present cooling system. Although not required, it is preferable to allow the cooling gas in the gas chamber 104 to contact the display 10 directly. In this way, the convective effect of the circulating gas will be maximized. Preferably the gas, which has absorbed heat from the display 10 may then be diverted to the refrigeration unit 110 by way of the return air passage 106.

To maintain efficiency of the refrigeration unit 110, a third cooling loop may be utilized, wherein ambient air may be passed through the external housing 80. The ambient air enters the external housing through vent openings 116 and exits through vent exits 118. The ambient air passing through the vent openings 116 and exits 118 carries away heat generated by the refrigeration unit 110.

The refrigeration unit may also cool the air which travels within the constricted convection channel 50. The refrigeration unit may also contain a means to force the cooled air into the constricted convection channel 50. This means may include one or more fans and one or more septa.

An optional air filter (not shown) may be employed within the isolated gas cooling system 100 to assist in preventing contaminates and dust from entering the gas chamber 104. It is also understood that any cooling loop may include cooled air, and as stated above the cooling loop may also provide heated air.

The constricted convection cooling system may also be used in conjunction with an air curtain as described in Co-pending application Ser. No. 11/941,728, hereby incorporated by reference in its entirety.

Having shown and described the preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A system for cooling an electronic display having a posterior display surface and contained within a housing, the system comprising:
   a constricted convection plate placed posterior to the posterior display surface;
   two side panels placed adjacent to the constricted convection plate and the posterior display surface, defining a constricted convection channel having an entrance and an exit; and
   a fan placed to draw air from outside of the housing through the constricted convection channel.

2. The cooling system from claim 1 further comprising:
   an air conditioning unit in gaseous communication with the entrance to the constricted convection channel.

3. The cooling system from claim 1 further comprising:
   a thermoelectric unit in gaseous communication with the entrance to the constricted convection channel.

4. A liquid crystal display (LCD) comprising:
   a liquid crystal stack;
   a backlight assembly behind the liquid crystal stack and comprising:
      a metal core printed circuit board (PCB) having front and back sides;
      a plurality of LEDs mounted on the front side of the PCB;
      a posterior surface on the rear side of the PCB;
   a constricted convection plate placed behind the posterior surface of the PCB, defining a constricted convection channel having an entrance and an exit; and
   a fan positioned to draw air through the constricted convection channel.

5. The LCD from claim 4 further comprising:
   an air conditioning unit in gaseous communication with the entrance to the constricted convection channel.

6. The LCD from claim 4 further comprising:
   a thermoelectric unit in gaseous communication with the entrance to the constricted convection channel.

7. The LCD from claim 4 wherein:
   the fan is placed near the exit of the constricted convection channel.

8. The LCD from claim 4 further comprising:
   a plurality of access apertures through the constricted convection plate.

9. A system for cooling an electronic display comprising:
   an electronic display comprising a front display surface and a posterior surface;
   a constricted convection plate and a pair of sidewalls behind the posterior surface of the display, defining a constricted convection channel having an entrance and exit;
   a gaseous closed loop traveling across the front display surface, behind the constricted convection plate, and returning to the front display surface;
   a means for propelling gas around the closed loop;
   a means for cooling the gas in the closed loop; and
   a means for forcing air through the constricted convection channel.

10. The cooling system from claim 9 further comprising:
    a plurality of access apertures through the constricted convection plate.

11. The cooling system from claim 9 wherein:
    the means for cooling the gas in the closed loop comprises a refrigeration unit.

12. The cooling system from claim 9 wherein:
    the means for cooling the gas in the closed loop comprises a thermoelectric module.

13. The cooling system from claim 9 wherein:
    the means for propelling the gas around the closed loop comprises a plurality of fans within the closed loop.

14. The cooling system from claim 12 wherein:
the means for propelling the gas around the closed loop comprises a plurality of fans within the thermoelectric module.

15. The cooling system from claim 11 wherein:
the means for propelling the gas around the closed loop comprises a plurality of fans within the refrigeration unit.

16. The cooling system from claim 9 wherein:
the means for forcing air through the constricted convection channel comprises a plurality of fans placed near the exit of the constricted convection channel.

17. The cooling system from claim 9 further comprising:
a means for cooling the air being forced through the constricted convection channel.

18. The cooling system from claim 9 wherein:
the electronic display comprises an LED backlight LCD display where the posterior surface is the rear surface of a backlight assembly.

19. The cooling system from claim 11 further comprising:
an ambient air intake and exhaust within the refrigeration unit.

20. The cooling system from claim 12 further comprising:
an ambient air intake and exhaust within the thermoelectric module.

* * * * *